US007020764B2

(12) United States Patent
Kubota et al.

(10) Patent No.: US 7,020,764 B2
(45) Date of Patent: Mar. 28, 2006

(54) SEMICONDUCTOR PROCESSING DEVICE

(75) Inventors: Hideo Kubota, Higashimurayama (JP); Takanaga Yamazaki, Tama (JP)

(73) Assignee: Renesas Technology Corp., Tokyo (JP)

( * ) Notice: Subject to any disclaimer, the term of this patent is extended or adjusted under 35 U.S.C. 154(b) by 345 days.

(21) Appl. No.: 10/621,330

(22) Filed: Jul. 18, 2003

(65) Prior Publication Data

US 2004/0017724 A1 Jan. 29, 2004

(30) Foreign Application Priority Data

Jul. 24, 2002 (JP) .............................. 2002-215062

(51) Int. Cl.
*H03K 19/173* (2006.01)
*G06F 15/76* (2006.01)

(52) U.S. Cl. ..................... 712/37; 712/14; 365/185.33; 326/38; 326/39

(58) Field of Classification Search .................. 326/38, 326/39
See application file for complete search history.

(56) References Cited

U.S. PATENT DOCUMENTS 6,337,579 B1 * 1/2002 Mochida ..................... 326/41
6,438,737 B1 * 8/2002 Morelli et al. ................ 716/16
6,492,833 B1 * 12/2002 Asson et al. .................. 326/41
6,819,133 B1 * 11/2004 Kliesner et al. ............... 326/8
6,831,481 B1 * 12/2004 Nguyen et al. ............... 326/58
6,862,220 B1 * 3/2005 Kawahara et al. ..... 365/185.28
6,901,502 B1 * 5/2005 Yano et al. .................... 712/37

FOREIGN PATENT DOCUMENTS

JP 5-233844 9/1993

* cited by examiner

*Primary Examiner*—Vibol Tan
(74) *Attorney, Agent, or Firm*—Miles & Stockbridge PC

(57) ABSTRACT

A useful semiconductor processing device (LSI) is capable of implementing the precise setting of signals at the final stage of user system development and enabling the user to build a logic circuit in the device in a very short time. The LSI includes a CPU, a flash memory which is a nonvolatile memory, a programmable logic which is a SRAM-type field programmable gate array, and a configuration circuit which implements the logic circuit configuration operation. At the event of power-on reset, logic building data stored in the flash memory is transferred to the programmable logic to establish a logic circuit in it under control of the configuration circuit, so that the logic circuit built in the programmable logic can be used immediately after the power-on reset of the device.

10 Claims, 15 Drawing Sheets

FIG. 1

| | START-UP TIME | HARDWARE VOLUME | PROGRAM CAPACITY | CONFIGURATION TIMING |
|---|---|---|---|---|
| CPU | SLOW (COMMAND FETCH NEEDED) | EXISTING HARDWARE | NEEDED | AFTER RESET |
| DMAC | MEDIUM (SETUP BY CPU NEEDED) | EXISTING HARDWARE | NEEDED | AFTER RESET |
| CONFIGURATION CIRCUIT | FAST (SETUP NO-NEED) | EXCLUSIVE HARDWARE | NO-NEED | DURING RESET OR AFTER RESET |

# SEMICONDUCTOR PROCESSING DEVICE

BACKGROUND OF THE INVENTION

The present invention relates to a semiconductor processing device, and particularly to a technique which is applied effectively to a semiconductor processing device which incorporates an SRAM-type field programmable gate array (FPGA) and a nonvolatile memory such as a flash memory.

A study conducted by the inventors of the present invention has revealed the following trend of technology pertaining to LSI devices such as microcomputers and electronic appliances which incorporate the LSI devices.

In the recent industry of electronic appliances which incorporate microcomputers, there is arising a demand of field programmability which facilitates the alteration and adjustment of microcomputer programs which become necessary throughout the stages of development, prototype manufacturing, preparation of production and large-scale production for the sake of dealing with the increase in the volume of programs, the reduction of product development time, the improvement of performance, and the adjustment of control data. To meet this demand, one-chip microcomputers which incorporate central processing units (CPU) and flash memories are being developed.

The LSI user who constructs a practical system deals with the need of precise tuning of signals and customization, which cannot be done solely by the software alteration in the flash memory, by mounting a field programmable gate array and programmable logic device on a system board and connecting these parts with the LSI on the board. The field programmable gate array and programmable logic device enable the LSI user to realize a logic circuit on the LSI in a very short time based on a high-grade descriptive language and logical drawing.

A technique of mounting an LSI and a field programmable gate array on the user board is described in Japanese Unexamined Patent Publication No. Hei 5(1993)-233844 for example. This patent publication discloses a semiconductor device which includes an SRAM-type field programmable gate array and a PROM which stores data for establishing a logic circuit on the array.

SUMMARY OF THE INVENTION

A study conducted by the inventors of the present invention on the technique of mounting an LSI and a field programmable gate array on the user board has revealed the following problems.

The technique of mounting a separate LSI and field programmable gate array on a user board is problematic in: (1) Higher cost due to increased parts on the user board and longer development time due to the intricate circuit board design; (2) Degraded performance and quality caused by on-board wiring which imposes signal delay and noise problem; (3) Higher development cost due to separate chip development and assessment.

The above-mentioned technique of patent publication No. Hei 5(1993)-233844 is intended to store data of SRAM-type field programmable gate array in a PROM instead of a flash memory.

The inventors of the present invention have found that by designing an LSI having already a flash memory to further incorporate a field programmable gate array, it becomes possible for the LSI user to implement the precise tuning and customization which has been difficult solely by the software alteration at the time of system design, establish a logic circuit on the LSI in a very short time, and realize a useful LSI. The SRAM-type field programmable gate array, which necessitates logic establishment at each power-on starting, can build the FPGA logic efficiently based on the incorporation of a control circuit for transferring logic building data within the same chip.

Mounting a flash memory and a field programmable gate array on one chip signifies the accomplishment of both of field programmability of software and field programmability of hardware by one chip, which enables easy management of logic building for the LSI user. Based on the incorporation on the same chip of the control circuit for transferring the logic building data from the internal flash memory, the LSI user can manage the logic building more efficiently.

In the case of using a field programmable gate array which is initialized at each power-on event of the user board, it is necessary to build the FPGA logic at each power-on, and the transfer of logic building data over the board makes the system inferior in terms of security.

Whereas, by mounting a flash memory on the LSI, with logic building data being stored therein, and incorporating the logic building data transfer control circuit on the LSI, it becomes possible to build a logic in the field programmable gate array by transferring the logic building data from the flash memory to the array without being exposed to the outside of LSI, and it is very effective for maintaining the security of the customized FPGA logic.

Accordingly, it is an object of the present invention to provide a semiconductor processing device which incorporates an SRAM-type field programmable gate array, a nonvolatile memory such as a flash memory, and a control circuit for transferring logic building data, and is intended to enable the LSI user to establish a logic circuit on the LSI in a very short time thereby to accomplish a useful LSI.

These and other objects and novel features of the present invention will become apparent from the following description and attached drawings.

Among the affairs of the present invention disclosed in this specification, representatives are briefed as follows.

The present invention is applied to a semiconductor processing device which comprises a central processing unit (CPU), an SRAM-type field programmable gate array (FPGA) which establishes a logic circuit based on logic building data written thereto, a nonvolatile memory which stores the logic building data, and a configuration circuit which implements the configuration operation for the SRAM-type FPGA by using the logic building data stored in the nonvolatile memory. The device has the following features.

(1) The configuration circuit has a function of transferring the logic building data in the nonvolatile memory to the SRAM-type field programmable gate array at the time of power-on reset. It further has a function of deactivating the internal reset signal on completion of configuration operation, and a function of initiating a peripheral semiconductor device upon detecting the completion of configuration operation based on the access to a certain terminal of the device or in response to a signal for indicating the end of configuration operation, so that it is adapted particularly to a nonvolatile memory such as a flash memory.

(2) The configuration circuit has a function of reforming, during the ordinary operation, part of the logic building data in the SRAM-type field programmable gate array which has been transferred from the nonvolatile memory.

(3) The device has terminals in correspondence to the logic building data or has a logic building data transfer control mode selection signal, and the configuration circuit has a function of transferring the logic building data in the nonvolatile memory in correspondence to the terminals or selection signal to the SPAM-type field programmable gate array, so that it is adapted particularly to a nonvolatile memory such as a flash memory.

(4) The device has a register for storing a number of pieces of transfer control information corresponding to the logic building data, and the configuration circuit has a function of selecting logic building data in the nonvolatile memory in correspondence to the information stored in the register and transferring the selected data to the SRAM-type field programmable gate array, so that it is adapted particularly to a nonvolatile memory such as a flash memory.

BRIEF DESCRIPTION OF THE DRAWINGS

FIG. 1 is a diagram explaining by comparison the use of the resources in the configuration operation;

DESCRIPTION OF THE PREFERRED EMBODIMENTS

Embodiments of this invention will be explained in detail with reference to the drawings. Throughout the drawings, items having the same functions are referred to by the common symbols, and explanation thereof is not repeated.

This invention is applied to a semiconductor processing device which comprises an SRAM-type field programmable gate array and a nonvolatile memory such as a flash memory. In the following embodiments, the LSI device further incorporates a dedicated configuration circuit in consideration of: (1) The SRAM-type field programmable gate array always implements the first-time configuration operation (logic establishment on the array) immediately after power is turned on; (2) Data used for the first configuration of the array is usually stored in a nonvolatile memory (e.g., flash memory) together with the CPU operation program; (3) The configuration operation can take place during the ordinary operation also.

There are some advantages in the inclusion of a dedicated configuration circuit in the LSI. FIG. 1 compares the use of the resources (CPU, DMAC and configuration circuit) in the configuration operation. Major advantages of having a dedicated hardware of configuration circuit formed in the LSI are: (1) The SRAM-type field programmable gate array which is free from the CPU's software intervention can appear to be a hardware logic; (2) The field programmable gate array is assumed to be a nonvolatile FPGA based on the structure of the internal flash memory and configuration circuit.

Specifically, the configuration circuit starts up faster (setup unneeded) as compared with the CPU and DMAC, and it can operate in a state of rest or after resetting. In consequence, the logic building data in the nonvolatile memory can be transferred to the array without waiting for the CPU's transfer control at the time of power-on reset, in contrast to the transfer of logic circuit building data implemented by the CPU and DMAC, whereby it becomes possible to use the logic circuit built on the array immediately following the power-on reset.

The following embodiments of this invention are semiconductor processing devices each comprising a central processing unit (CPU), a SRAM-type field programmable gate array which establishes a logic circuit based on logic building data written thereto, a nonvolatile memory such as a flash memory which stores the logic building data, and a configuration circuit which implements the configuration operation for the array by using the logic building data stored in the nonvolatile memory.

Embodiment 1

Figure 2:
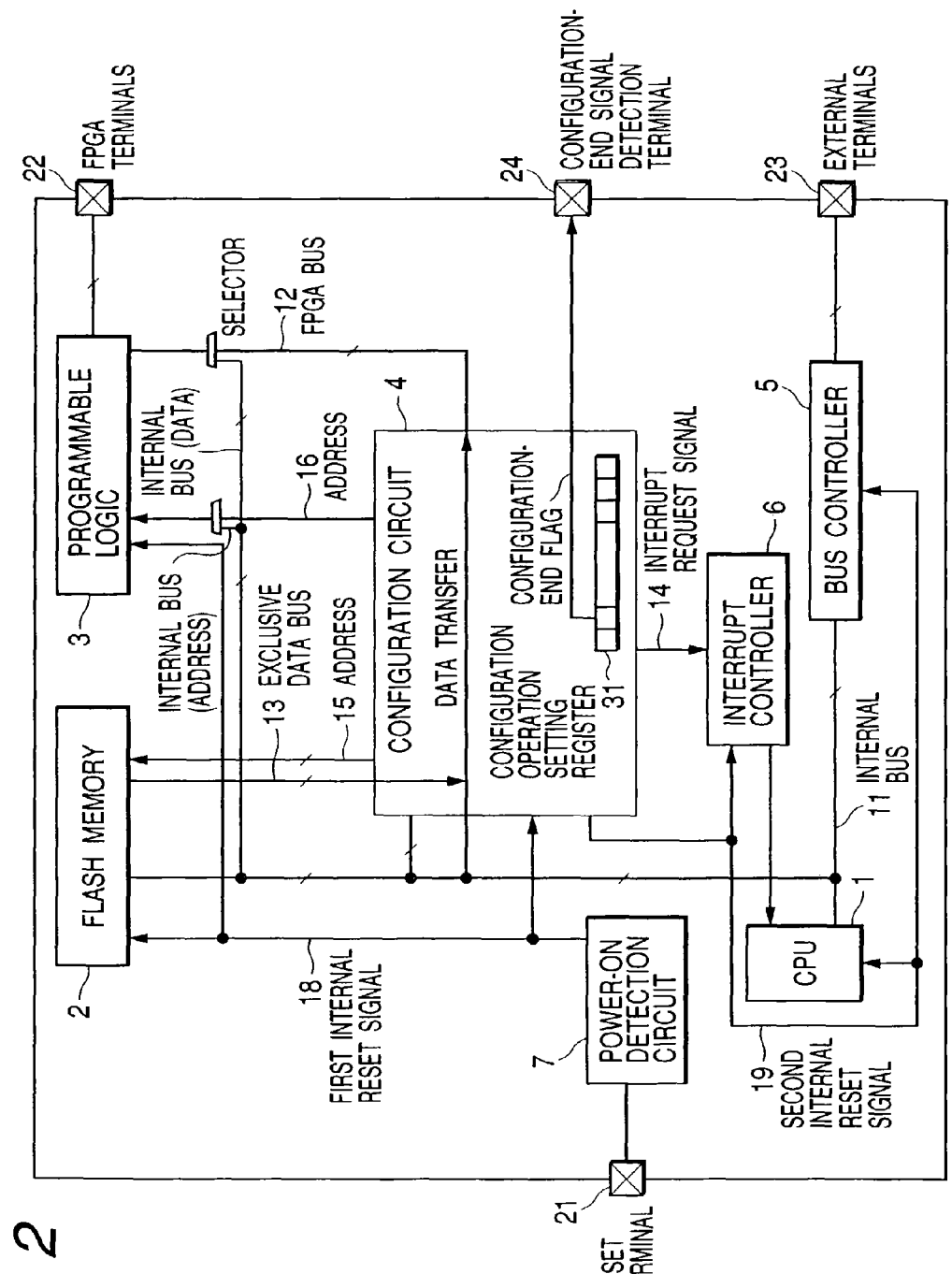
FIG. 2 is a block diagram showing a semiconductor processing device based on a first embodiment of this invention.
Figure 3:
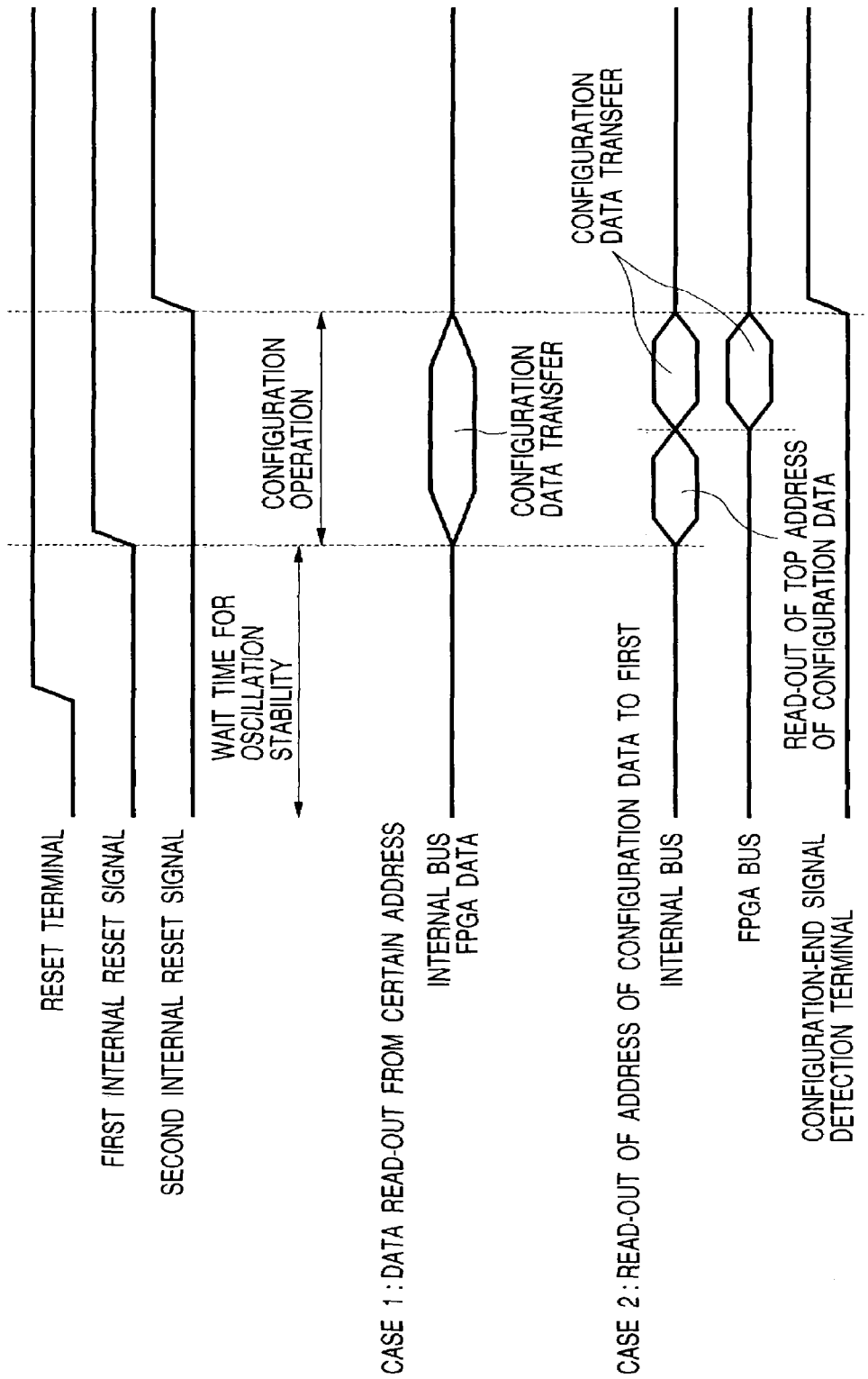
FIG. 3 is a timing chart showing the configuration operation of the semiconductor processing device of the first embodiment.
Figure 4:
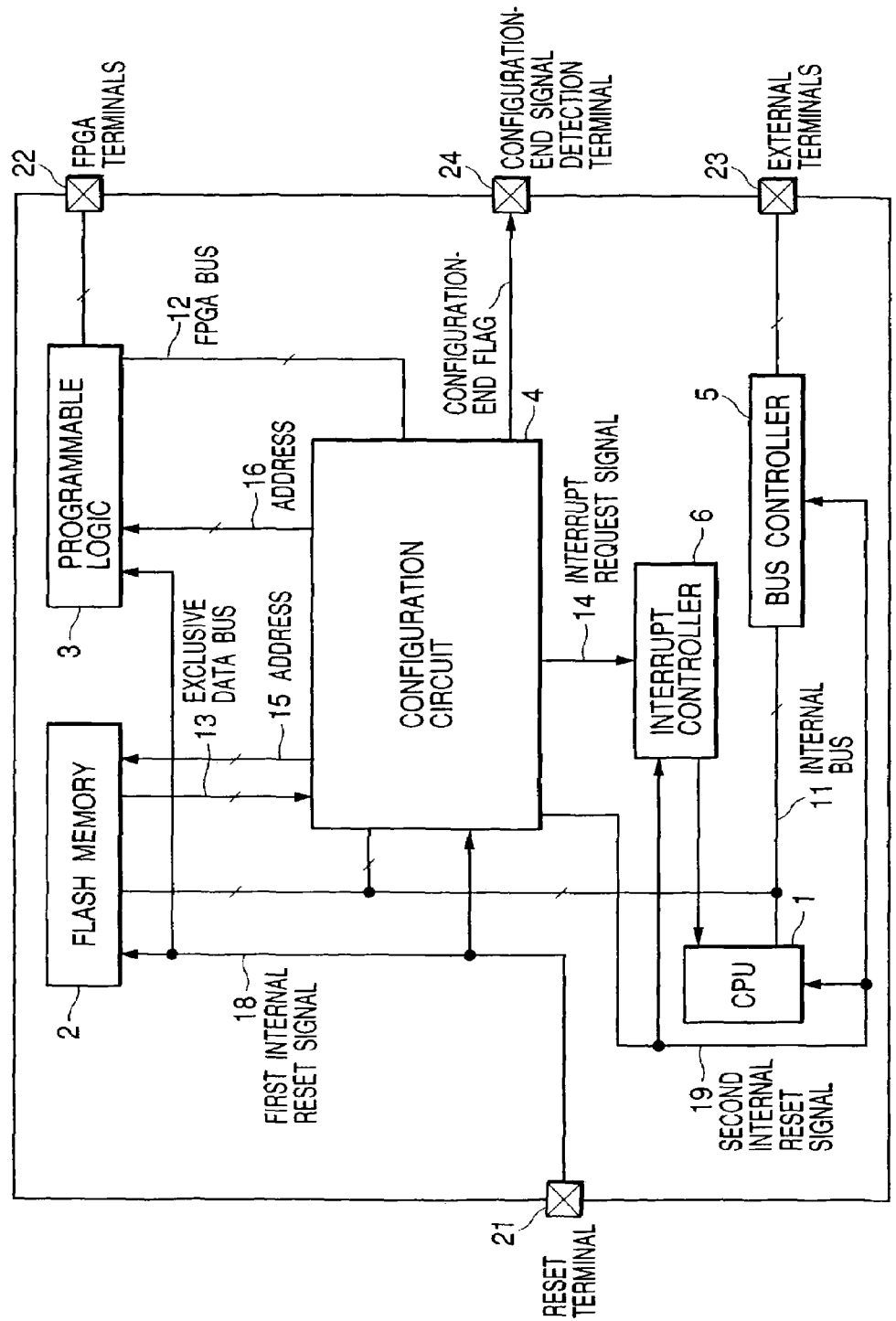
FIG. 4 is a block diagram showing a semiconductor processing device based on a variant of the first embodiment of this invention.
Figure 5:
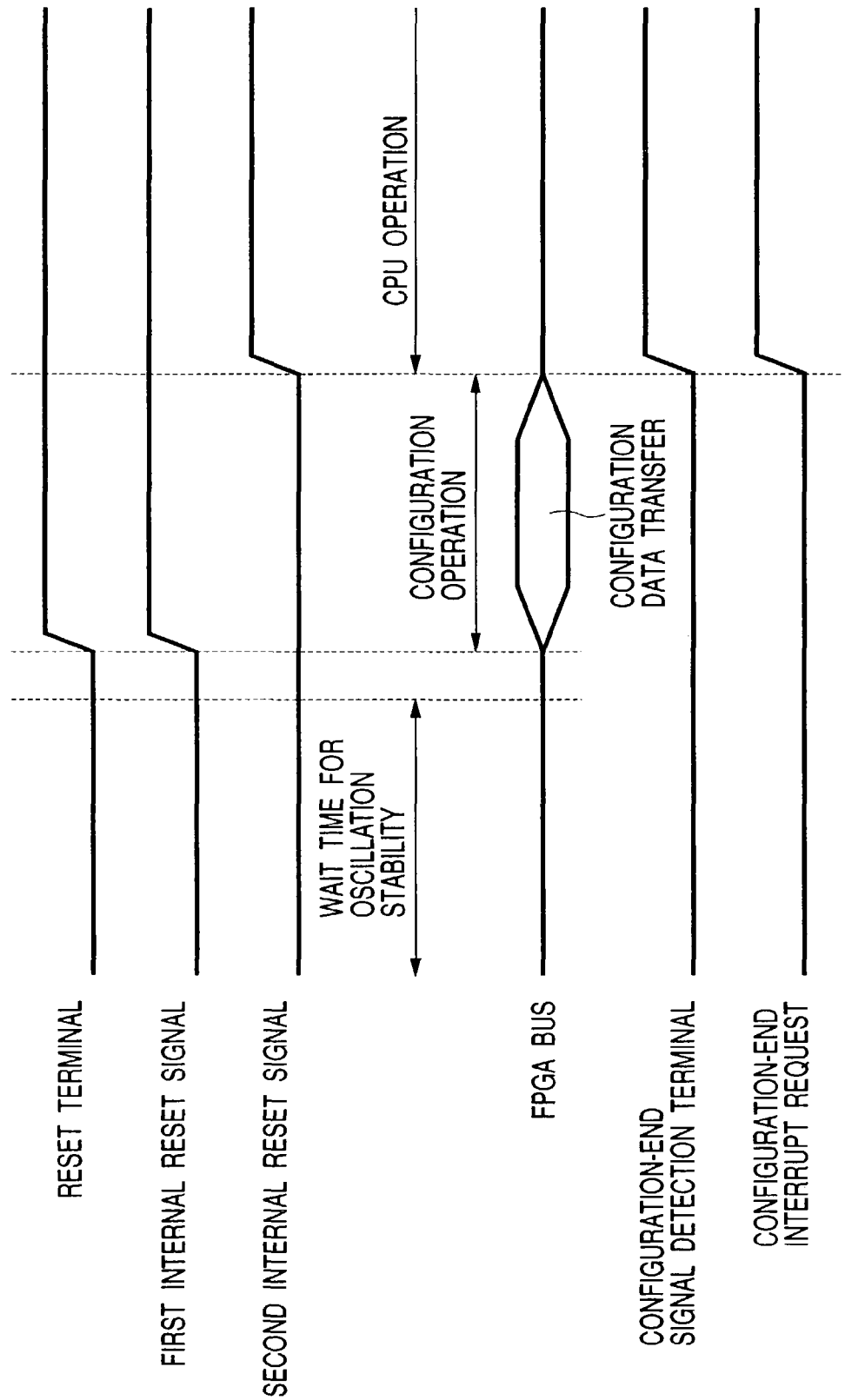
FIG. 5 is a timing chart showing the configuration operation of the semiconductor processing device of this variant embodiment.
Figure 6:
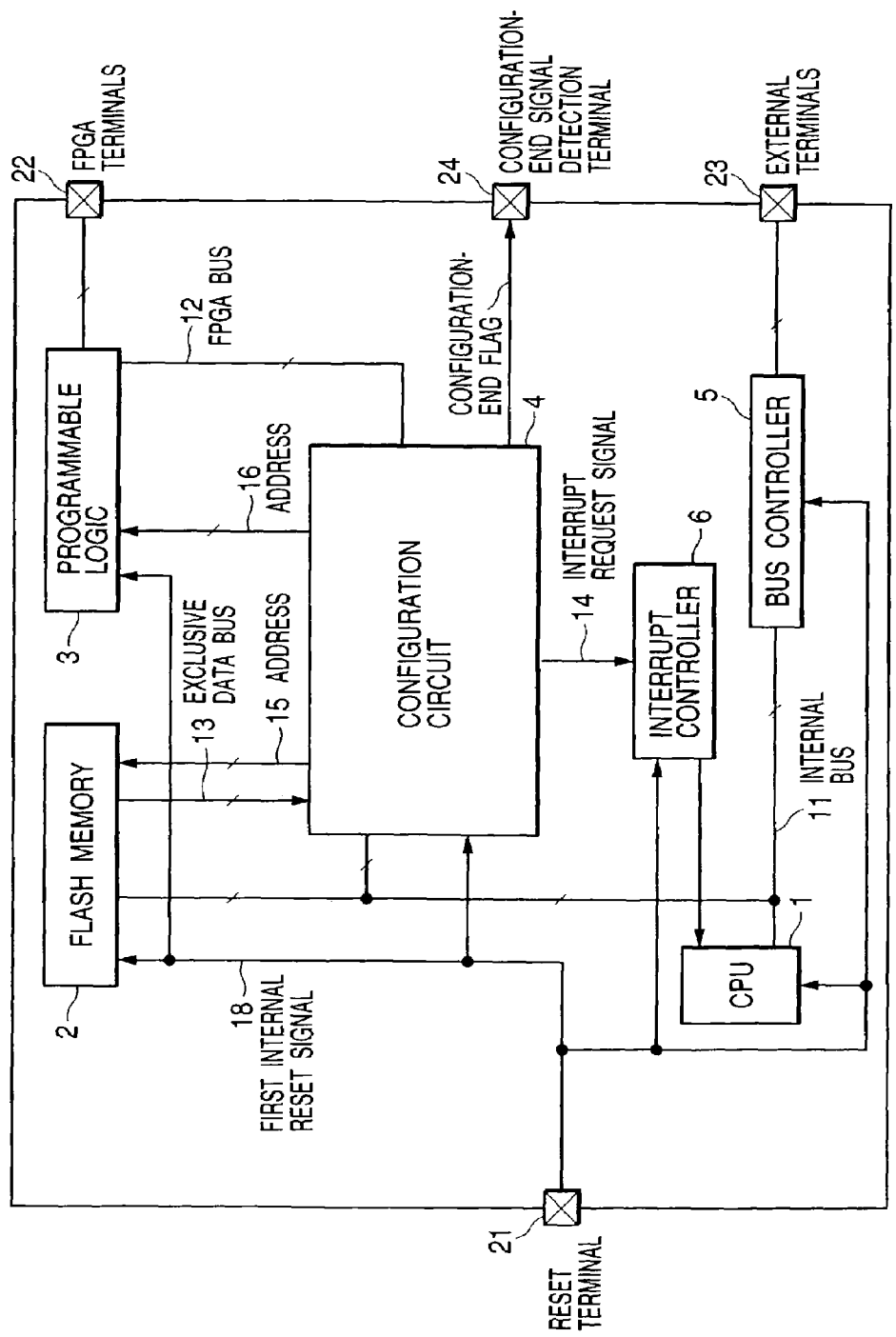
FIG. 6 is a block diagram showing a semiconductor processing device based on another variant of the first embodiment of this invention.
Figure 7:
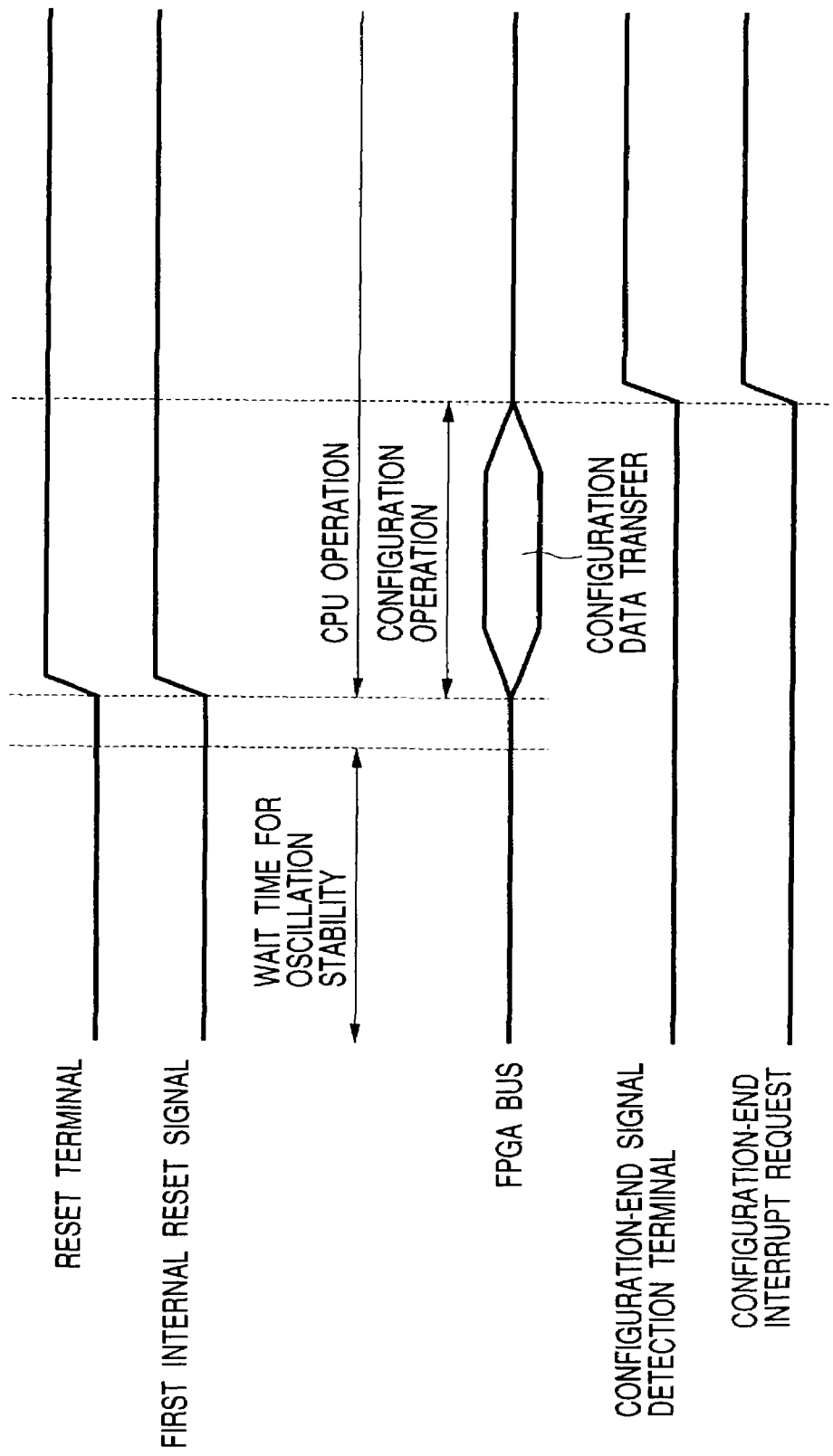
FIG. 7 is a timing chart showing the configuration operation of the semiconductor processing device of the other variant embodiment.

The arrangement and operation of the semiconductor processing device based on the first embodiment of this invention will be explained with reference to FIG. 2 through FIG. 7. FIG. 2 shows by block diagram the semiconductor processing device of this embodiment, FIG. 3 shows by timing chart the configuration operation of the device, FIG. 4 and FIG. 5 show the arrangement and configuration operation of a variant of this embodiment, and FIG. 6 and FIG. 7 show the arrangement and configuration operation of another variant of this embodiment.

The semiconductor processing device (LSI) of this embodiment includes a central processing unit (CPU) 1 which implements the computational process of the whole LSI, a flash memory 2 which is a nonvolatile memory, a programmable logic 3 which is an SRAM-type field programmable gate array, a configuration circuit 4, a bus controller 5, an interrupt controller 6, and a power-on sense circuit 7. The CPU 1, flash memory 2, configuration circuit 4, programmable logic 3 and bus controller 5 are connected through internal buses 11 including a data bus and address bus, and the programmable logic 3 and configuration circuit 4 are connected through an FPGA bus 12. The configuration circuit 4 is further connected to the flash memory 2 through a data bus 13 which is used exclusively for the transfer of configuration data. The FPGA bus 12 and address bus 16 may be connected to the programmable logic 3 through selectors so that bus selection is made possible among the internal bus 11, FPGA bus 12 and address bus 16. The FPGA bus 12 and address bus 16 are selected for the configuration operation, while the internal bus 11 is selected for the ordinary operation. This arrangement enables the configuration circuit 4 to be active only in the configuration operation, or otherwise enter the wait state or halt state, for the sake of power saving.

The LSI has external terminals including a reset terminal 21, FPGA terminals 22, external bus terminals 23, and configuration-end signal terminal 24. The reset terminal 21 is connected to the power-on sense circuit 7, the FPGA terminals 22 are connected to the programmable logic 3, the external bus terminals 23 are connected to the bus controller 5, and the configuration-end signal terminal 24 is connected to the configuration circuit 4. The external bus terminals 23 can be connected to an external memory or peripheral LSI transact data signals, address signals and control signals such as a chip select signal.

The configuration circuit 4 includes a configuration operation setting/control circuit, a decode circuit, a configuration start address/transfer data volume setting circuit, a peripheral circuit connection select setting circuit, and a reset control circuit. The configuration operation setting/control circuit has functions of address incrementing, transfer control, read-out of configuration data from memory areas and writing of configuration data to the programmable logic, counting of configuration data transfer volume, and control of configuration-end flag, configuration re-set bit, configuration interrupt request and clear. The decode circuit has functions of decoding of external signals and internal signals. The configuration start address/transfer data volume setting circuit has registers which can be accessed for rewriting by the CPU. The peripheral circuit connection select setting circuit has a function of setting automatically data which is read out of the flash memory following the read-out of configuration data at the time of power-on, and it can be accessed for rewriting by the CPU. The reset control circuit has a function of controlling the reset signal of circuits which are unrelated to the configuration operation after power is turned on.

The configuration circuit 4 issues an interrupt request signal 14 to the interrupt controller 6, a second internal reset signal 19 to the CPU 1, bus controller 5 and interrupt controller 6, an address signal 15 to the flash memory 2, and an address signal 16 to the programmable logic 3. The configuration circuit 4 is given a first internal reset signal 18 from the power-on sense circuit 7. The configuration circuit 4 can release via the configuration-end signal terminal 24 a signal of configuration-end flag which is set in the configuration operation setting register 31.

In the LSI of the foregoing arrangement, the configuration operation by the configuration circuit 4 takes place in a timing relation shown for example in FIG. 3 separately from the ordinary operation performed by the CPU 1.
(1) The LSI is given an active input signal on the reset terminal 21.
(2) The power-on sense circuit 7 detects the reset signal, and activates a first internal reset signal 18. The configuration circuit 4 waits until oscillation is stabilized.
(3) During the wait time, the configuration circuit 4 produces a second internal reset signal 19 from the first internal reset signal 18 provided by the power-on sense circuit 7 and distributes to circuit modules which are unrelated to the configuration operation.
(4) On expiration of the oscillation stabilization time, the power-on sense circuit 7 deactivates the first internal reset signal 18.
(5) The circuits related to the configuration operation start operating, and the configuration circuit 4 transfers automatically a certain amount of configuration data from an area (address space) of flash memory 2, which is specified by the address bus 15, by way of the exclusive data bus 13 and FPGA bus 12 to an area of programmable logic 3 specified by the address bus 16, thereby building a logic of the programmable logic 3. During the operation, the second internal reset signal 19 is kept active.
(6) After the transfer of configuration data by the configuration circuit 4 ends and a logic completes in the programmable logic 3, the configuration-end flag is set in the configuration operation setting register 31 in the configuration circuit 4.
(7) At this time, the second internal reset signal 19 is deactivated, and the ordinary operation by the CPU 1 starts.

Based on this timing relation of configuration operation by the configuration circuit 4, the following affairs are also possible.
(11) The input signal on the reset terminal 21 may be deactivated prior to the end of configuration operation.
(12) The programmable logic 3 has its logic already established when the ordinary operation by the CPU 1 starts, and therefore it is possible to make access to and operate the programmable logic 3 immediately.
(13) Based on the automatic release of the signal of configuration-end flag through the configuration-end signal terminal 24 as shown in FIG. 3, an external circuit can be informed of the accessibility to the FPGA terminals 22.
(14) Although in this embodiment, configuration data is stored in the flash memory 2 which usually stores programs and data of the user, these data may be stored in separate flash memories. Specifically, for example, user programs which deserve fast transfer are stored in an expensive high-speed flash memory, while configuration data which does not hurry in read-out is stored in a low-cost low-grade flash memory.
(15) In regard to the item (11), instead of reading out data from a certain area of the flash memory 2 following the activation of the signal on the reset terminal 21, an alternative scheme is to read out initially the leading address of the configuration data from a certain address of the flash memory 2 in the same manner as the vector fetch operation and subsequently read out the configuration data to implement the configuration operation as shown in FIG. 3. This scheme increases the latitude in user programming for the determination of a storing area of configuration data.
(16) The power-on sense circuit 7 may be included in the configuration circuit 4.
(17) Configuration data may be transfer based on the temporary occupation of the internal bus, besides the transfer through the exclusive data bus.

The configuration circuit 4 may function as a bridge circuit for connecting the internal bus 11 to the programmable logic 3 following the transfer of configuration data to the programmable logic 3.

The FPGA bus 12 can operate as a data bus in the ordinary operation, besides the inherent function of transferring configuration data.

The address bus 15 can be used for specifying an address for the transfer of configuration data which is stored in an arbitrary area of the flash memory 2.

The address bus 16 may be used for specifying an address for storing data other than configuration data in an arbitrary area of the programmable logic 3.

In consequence, this embodiment attains the effectiveness of: (1) The reset input can be deactivated at any time point irrespective of the oscillation stabilization time; (2) The programmable logic 3 can be configured automatically on expiration of the oscillation stabilization time without the need of special setting; (3) Configuration data can be stored in an arbitrary address space of the flash memory 2; (4) The programmable logic 3 is already configured when the CPU 1 starts the ordinary operation, and it can make access to the programmable logic 3 immediately; (5) The external circuit can be informed of the completion of configuration operation by checking the configuration-end signal terminal 24; (6) Based on the exclusive use of the data bus 13 for the transfer of configuration data, the configuration operation can take place without the need of bus control.

Next, the arrangement and operation of the semiconductor processing device based on a variant of the first embodiment will be explained with reference to FIG. 4 and FIG. 5.

The semiconductor processing device shown in FIG. 4 is derived from the preceding arrangement of FIG. 2, with the power-on sense circuit 7 being removed. The configuration operation by the configuration circuit 4 takes place in a timing relation as shown in FIG. 5.

(1) The LSI is given an active input signal on the reset terminal 21.
(2) A first internal reset signal 18 which is immediately derived from the input signal on the reset terminal 21 is distributed to the circuit modules in the LSI. At this time, the configuration circuit 4 distributes a second internal reset signal 19 to circuit modules which are unrelated to the configuration operation.
(3) The input signal on the reset terminal 21 is kept active longer than a prescribed oscillation stabilization time.
(4) The input signal on the reset terminal 21 is deactivated after the oscillation stabilization time expires.
(5) The first internal reset signal 18 turns off in response to the deactivation of the signal on the terminal 21, causing the configuration circuit 4 to transfer automatically a certain amount of configuration data from a certain area (address space) of the flash memory 2 to the programmable logic 3, thereby building a logic. The second internal reset signal 19 still retains active, and circuit modules which are unrelated to the configuration operation are halting.
(6) After the transfer of configuration data by the configuration circuit 4 ends and a logic completes in the programmable logic 3, the configuration-end flag is set in the configuration operation setting register 31 in the configuration circuit 4.
(7) At this time, configuration circuit 4 deactivates the second internal reset signal 19, and the ordinary operation by the CPU 1 starts.

Based on this timing relation of configuration operation by the configuration circuit 4, the following affairs are also possible.

(21) The external circuit can be informed of the accessibility to the FPGA terminals 22 based on the automatic release of the signal of configuration-end flag through the configuration-end signal terminal 24, instead of reading out the flag by the CPU 1. The end of configuration operation can also be informed based on the issuance of an interrupt request signal 14 from the configuration circuit 4 to the interrupt controller 6.
(22) An exclusive data bus 13 may be provided for reading out configuration data from the flash memory 2, besides the use the internal bus 11 which is shared with the CPU 1.
(23) The preceding items (12)–(15) pertinent to the timing relation shown in FIG. 3 are also relevant to this variant embodiment.

In consequence, this variant of the first embodiment attains the effectiveness of: (1) The configuration operation for the programmable logic 3 can take place automatically without the need of special setting following the deactivation of the reset signal; (2) Configuration data can be stored in an arbitrary address space of the flash memory 2; (3) The programmable logic 3 is already configured when the CPU 1 starts the ordinary operation, and it can make access to the programmable logic 3 immediately; (4) The external circuit can be informed of the completion of configuration operation by checking the configuration-end signal terminal 24; (5) Based on the exclusive use of the data bus 13 for the transfer of configuration data, the configuration operation can take place without the need of bus control.

Next, the arrangement and operation of the semiconductor processing device based on another variant of the first embodiment will be explained with reference to FIG. 6 and FIG. 7.

The semiconductor processing device shown in FIG. 6 is derived from the preceding arrangement of FIG. 4, with a difference being that the second internal reset signal 19 is produced immediately from the input signal on the reset terminal 21, instead of being produced by the configuration circuit 4. The configuration operation by the configuration circuit 4 takes place in a timing relation as shown in FIG. 7.

(1) The LSI is given an active input signal on the reset terminal 21.
(2) A first internal reset signal 18 which is immediately derived from the input signal on the reset terminal 21 is distributed to the circuit modules in the LSI.
(3) The input signal on the reset terminal 21 is kept active longer than a prescribed oscillation stabilization time.
(4) The signal on the reset terminal 21 is deactivated on expiration of the oscillation stabilization time.
(5) In response to the deactivation of the signal on the terminal 21, the CPU 1 starts the ordinary operation and the configuration circuit 4 transfers automatically a certain amount of configuration data from a certain area (address space) of the flash memory 2 to the programmable logic 3, thereby building a logic.
(6) After the transfer of configuration data by the configuration circuit 4 ends and a logic completes in the programmable logic 3, the configuration-end flag is set in the configuration operation setting register 31 in the configuration circuit 4.

Based on this timing relation of configuration operation by the configuration circuit 4, the following affairs are also possible.

(31) The LSI recognizes the accessibility to the programmable logic 3 based on the read-out of the configuration-end flag by the CPU 1.
(32) The configuration circuit 4 may be provided with a write protection function (bit) so that the register for the configuration operation is not overwritten during the configuration operation.

(33) As in the case where a program protection function allows the external read access to read only "0"s strings once it is attempted, so that the CPU 1 only is allowed to read out the contents of the flash memory 2, read access to configuration data is also controlled so that data cannot be read out from the programmable logic 3 over the FPGA bus 12 unless it is during the configuration operation. Namely, an enhanced security function may be provided so that data transferred over the FPGA bus 12 is not conducted to the internal bus except at data verification in the configuration operation.

(34) The preceding items (12)–(15) pertinent to the timing relation shown in FIG. 3 and items (21)–(22) pertinent to the timing relation shown in FIG. 5 are also relevant to this variant embodiment.

In consequence, this variant of the first embodiment attains the effectiveness of: (1) The configuration operation for the programmable logic 3 can take place automatically without the need of special setting following the deactivation of the reset signal; (2) Configuration data can be stored in an arbitrary address space of the flash memory 2; (3) The end of configuration operation can be recognized by checking the configuration-end signal terminal 24 or reading out the flag signal from the register; (4) Based on the exclusive use of the data bus 13 for the transfer of configuration data, the configuration operation can take place concurrently to the operation performed by the CPU 1.

Embodiment 2

Figure 8:
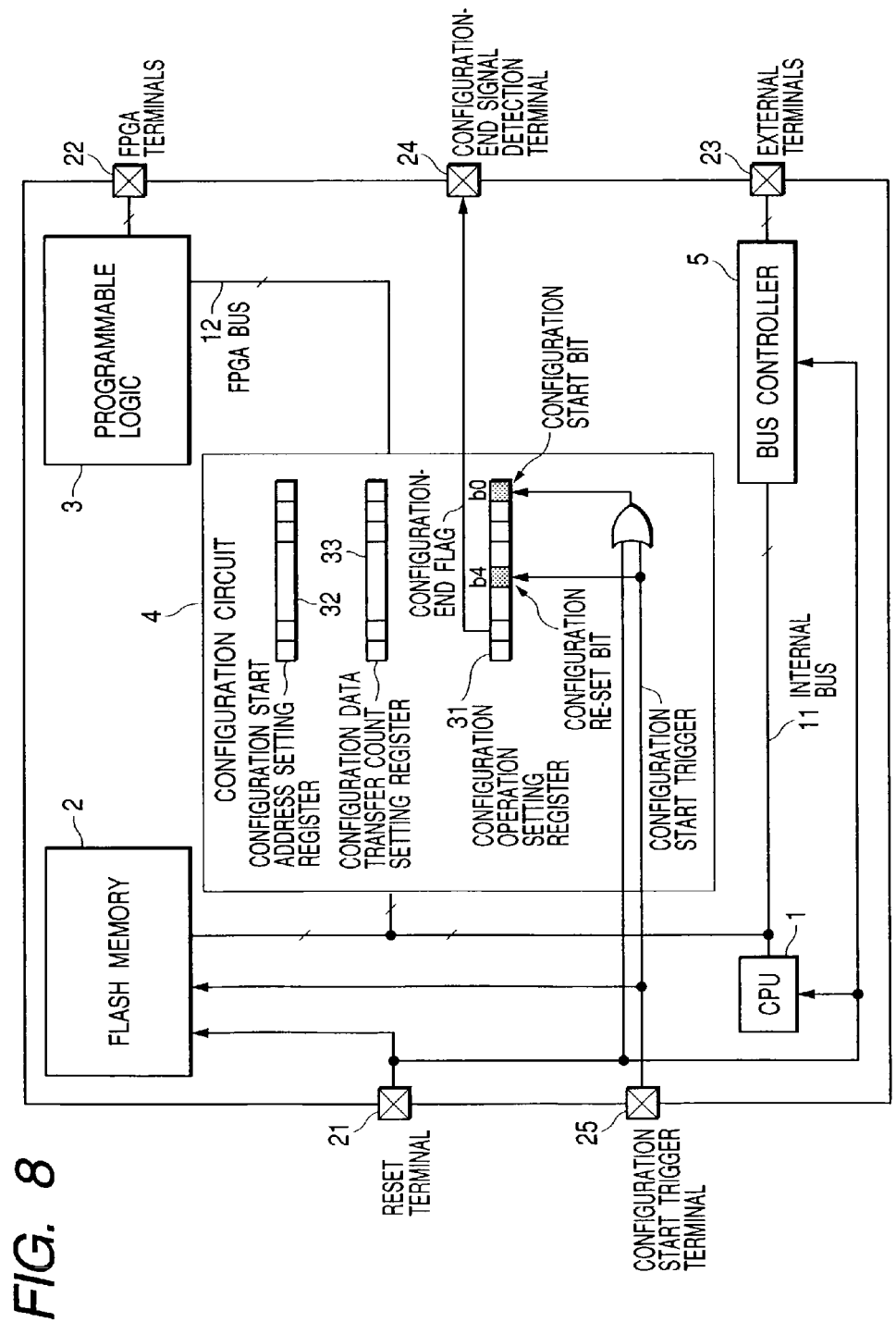
FIG. 8 is a block diagram showing a semiconductor processing device based on a second embodiment of this invention.
Figure 9:
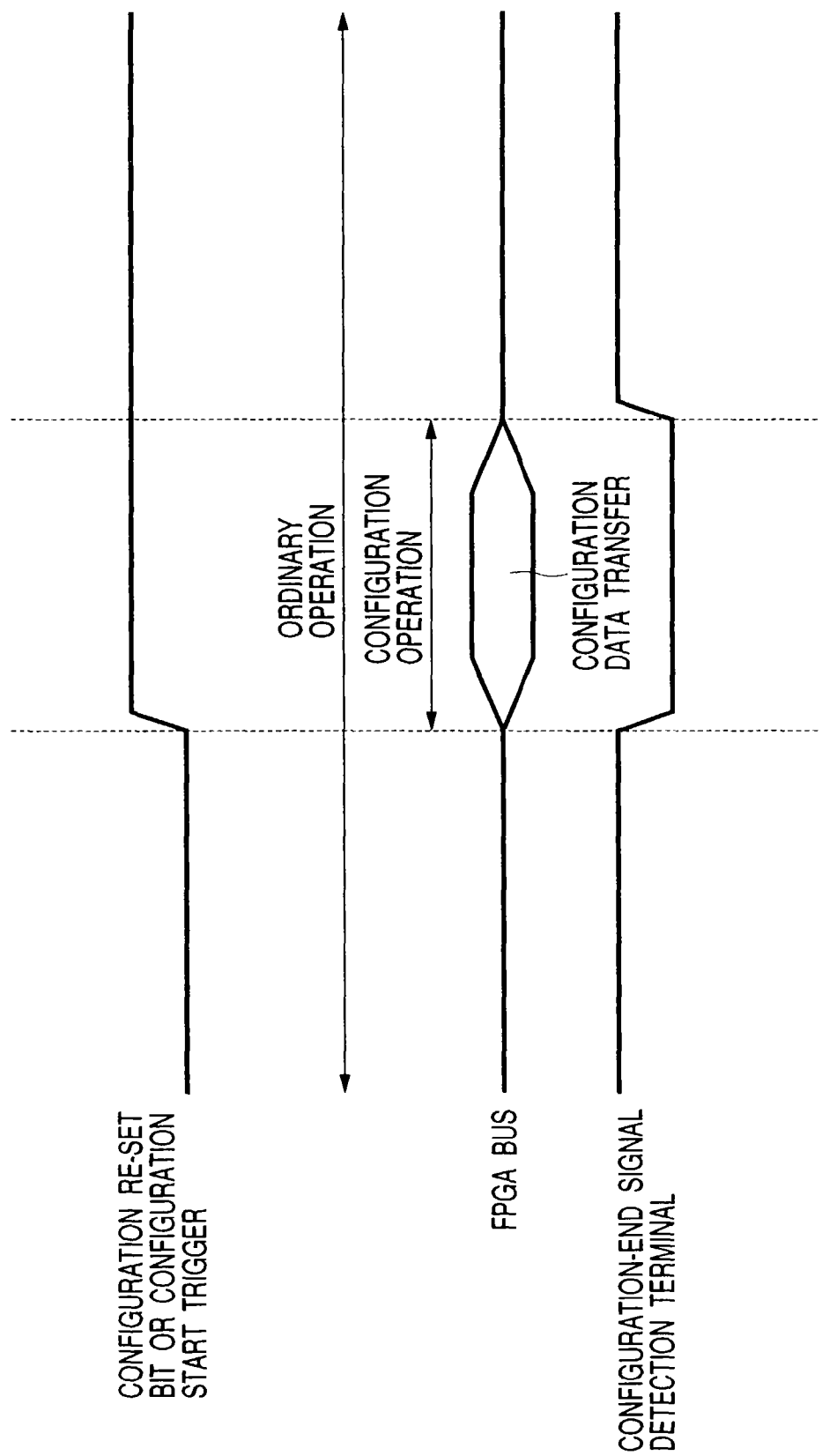
FIG. 9 is a timing chart showing the configuration operation of the semiconductor processing device of the second embodiment.

The arrangement and operation of the semiconductor processing device based on the second embodiment of this invention will be explained with reference to FIG. 8 and FIG. 9. FIG. 8 shows by block diagram the semiconductor processing device of this embodiment, and FIG. 9 shows by timing chart the configuration operation of the device.

The semiconductor processing device (LSI) of this embodiment includes a CPU 1, a flash memory 2, a programmable logic 3, a configuration circuit 4, and a bus controller 5. The LSI differs from the preceding first embodiment in that the configuration circuit 4 has a register for storing a read-out destination address of configuration data, so that the configuration operation is repeated by writing in a certain bit of the register in the configuration circuit 4 without the need of putting an activate input signal to the reset terminal from the outside.

Specifically, the configuration circuit 4 of this LSI includes a configuration operation setting register 31, a configuration start address setting register 32, and a configuration data transfer count setting register 33. The configuration operation setting register 31 includes a configuration start bit and a configuration re-set bit in addition to the configuration-end flag bit.

The LSI further includes a configuration start trigger terminal 25. An input signal entered through the terminal 25 sets the configuration re-set bit of the configuration operation setting register 31. The signal is rendered a computational process together with the input signal on the reset terminal 21 by a gate circuit, and a resulting signal sets the configuration start bit. As alternative operation, the CPU terminates the data processing on the field programmable gate array and sets the configuration start bit so that the configuration operation based on data from the flash memory to the array takes place again.

In this arrangement, the configuration operation (at configuration re-set) by the configuration circuit 4 takes place in a timing relation as shown in FIG. 9.

[1] The configuration operation starts when: (1) The reset terminal 21 has an active input signal; (2) The configuration start trigger terminal 25 has an active input signal; or (3) The configuration start bit of the configuration operation setting register 31 in the configuration circuit 4 is set by the CPU 1 via the internal bus 11. The event of item (1) or (2) is followed by automatic setting of the configuration start bit.

[2] The event of item (2) or (3) is followed by automatic setting of the configuration re-set bit of the configuration operation setting register 31 in the configuration circuit 4 In case the configuration re-set bit has been set, the read-out address of configuration data is read out from the configuration start address setting register 32 in the configuration circuit 4, and thereafter data is transferred from that address space to implement the configuration operation.

[3] The configuration circuit 4 also has a configuration data transfer count setting register 33 besides the configuration start address setting register 32. The provision of this register 33 enables the setting of the transfer volume of configuration data which is variable depending on the scale of logic to be built in the programmable logic 3, and therefore it is possible to re-build only part of logic in the programmable logic 3.

[4] This embodiment may include the functions explained in connection with the first embodiment.

In consequence, the second embodiment attains the effectiveness of: (1) The configuration operation can take place again during the ordinary operation after the reset state is lifted; (2) The configuration re-set operation can be accomplished by either entering a trigger input signal from the configuration start trigger terminal 25 or setting the bit by use of the CPU 1; (3) The storage area of configuration data can be expanded to the whole address-mapped area; (4) Even only part of the programmable logic 3 can be re-built based on the arbitrary setting of the volume of configuration data.

Embodiment 3

Figure 10:
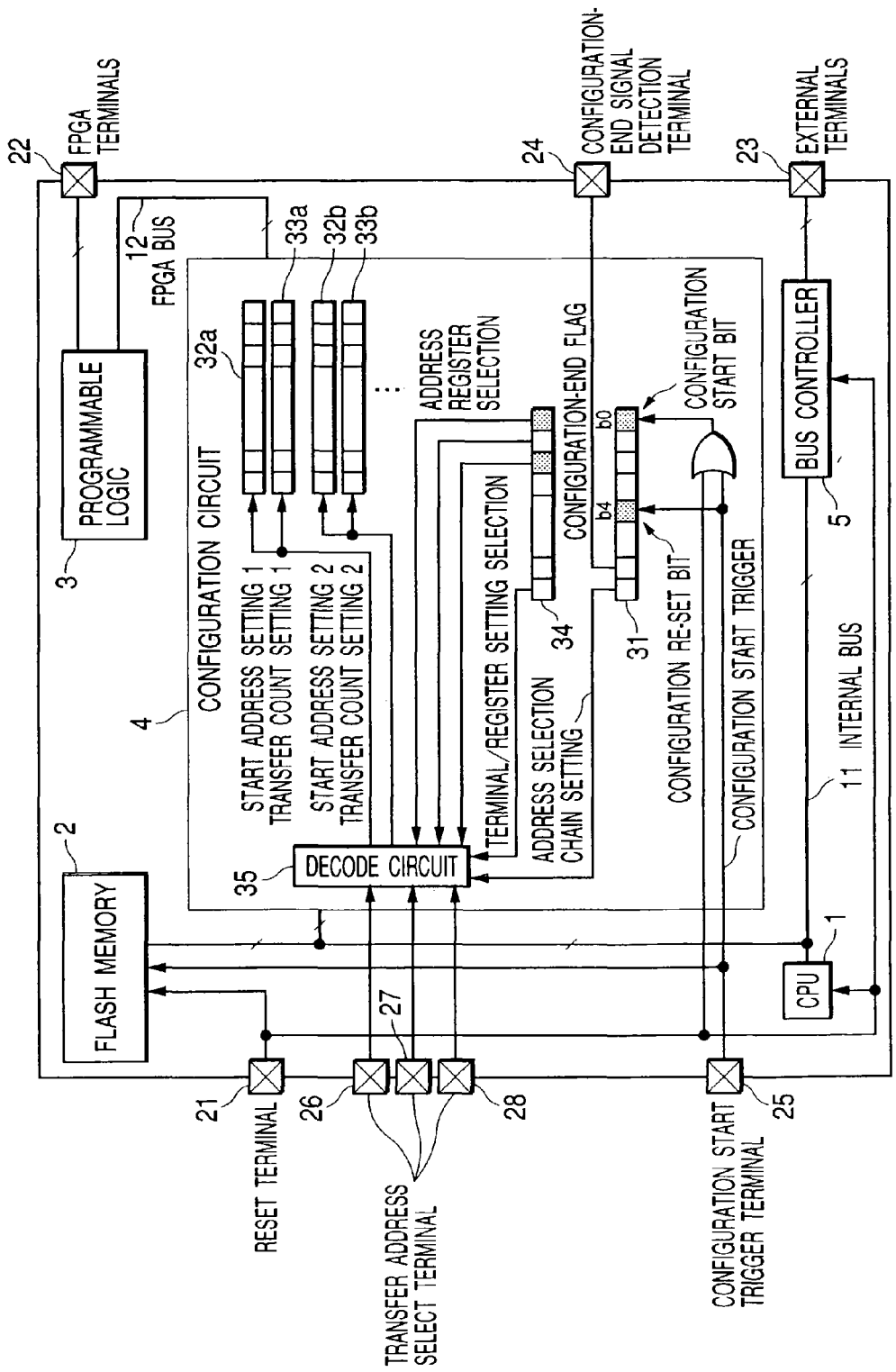
FIG. 10 is a block diagram showing a semiconductor processing device based on a third embodiment of this invention.

The arrangement and operation of the semiconductor processing device based on the third embodiment of this invention will be explained with reference to the block diagram of FIG. 10.

The semiconductor processing device (LSI) of this embodiment includes a CPU 1, a flash memory 2, a programmable logic 3, a configuration circuit 4, and a bus controller 5. The LSI differs from the preceding first and second embodiments in that it allows the prior setting of multiple addresses where configuration data are stored, with a read-out address of configuration data being either based on the input of an external signal to the terminal or based on the setting of the register in the configuration circuit 4.

Specifically, the configuration circuit 4 of this LSI includes a configuration operation setting register 31, configuration start address setting registers 32a,32b and so on, configuration data transfer count setting registers 33a,33b and so on, a configuration address selection register 34, and a decode circuit 35. The configuration operation setting register 31 stores a configuration-end flag, configuration start bit, configuration re-set bit, and chain setting bit. The configuration address selection register 34 stores an address register select bit and terminal/register setting select bit. These configuration start address setting registers 32a,32b and so on and configuration data transfer count setting registers 33a 33b and so on must have their content values data set in advance by control of the CPU 1.

The LSI has transfer address select terminals 26,27 and 28 for receiving external input signals, which are decoded by the decode circuit 35 for the selection of the configuration start address setting registers 32a,32b and so on, and configuration data transfer count setting registers 33a,33b and so on. Selection of these registers 32a,32b, . . . , 33a,33b and so on is also possible by use of the configuration address selection register 34 in the configuration circuit 4.

Based on this arrangement, the configuration circuit 4 implements the configuration operation in the same timing relation as the preceding first and second embodiments.

[1] The configuration circuit 4 includes a number of configuration start address setting registers 32a,32b and so on, and configuration data transfer count setting registers 33a,33b and so on, and an area of configuration data to be transferred at the commencement of configuration operation can be selected based on the setting of these registers. These configuration start address setting registers 32a,32b and so on and configuration data transfer count setting registers 33a 33b and so on must have their content values set in advance by the CPU 1.

[2] At the starting of the configuration operation: (1) in response to an active input signal put in to the reset terminal 21, or (2) in response to an active input signal put in to the configuration start trigger terminal 25 in the procedure (1) of the preceding second embodiment, it is possible to select among multiple settings (eight settings based on 3-bit signals on three select terminals in this embodiment) of configuration start address and transfer count based on the setting of the transfer address register select terminals 26,27 and 28.

[3] The selection of the above item [2] can be done also by the configuration address select register 34 in the configuration circuit 4. In this case, the value set by the configuration address select register 34 is put in to the decode circuit 35 which decodes the input signals on the transfer address register select terminals 26, 27 and 28, enabling the selection between setting of the transfer address register select terminals 26, 27 and 28, or the setup value of the configuration address select register 34.

[4] In contrast to the preceding embodiments up to the second embodiment, in which configuration data is transferred only once from a continuous address space to build a logic in the programmable logic 3, it is possible to deal with the case of configuration data stored in separate address spaces by transferring the data sequentially based on the setting of some of the configuration start address setting registers 32a,32b and so on and configuration data transfer count setting registers 33a 33b and so on. This chain operation of sequential data transfer is specified by the configuration operation setting register 31 in the configuration circuit 4.

[5] This embodiment may include the functions explained in connection with the first and second embodiments.

In consequence, the third embodiment attains the effectiveness of: (1) The configuration re-set operation can take place for arbitrary configuration data selected from among addresses which have been set in advance; (2) Continuous configuration operation can take place even if configuration data is stored in discontinuous address spaces.

Embodiment 4

Figure 11:
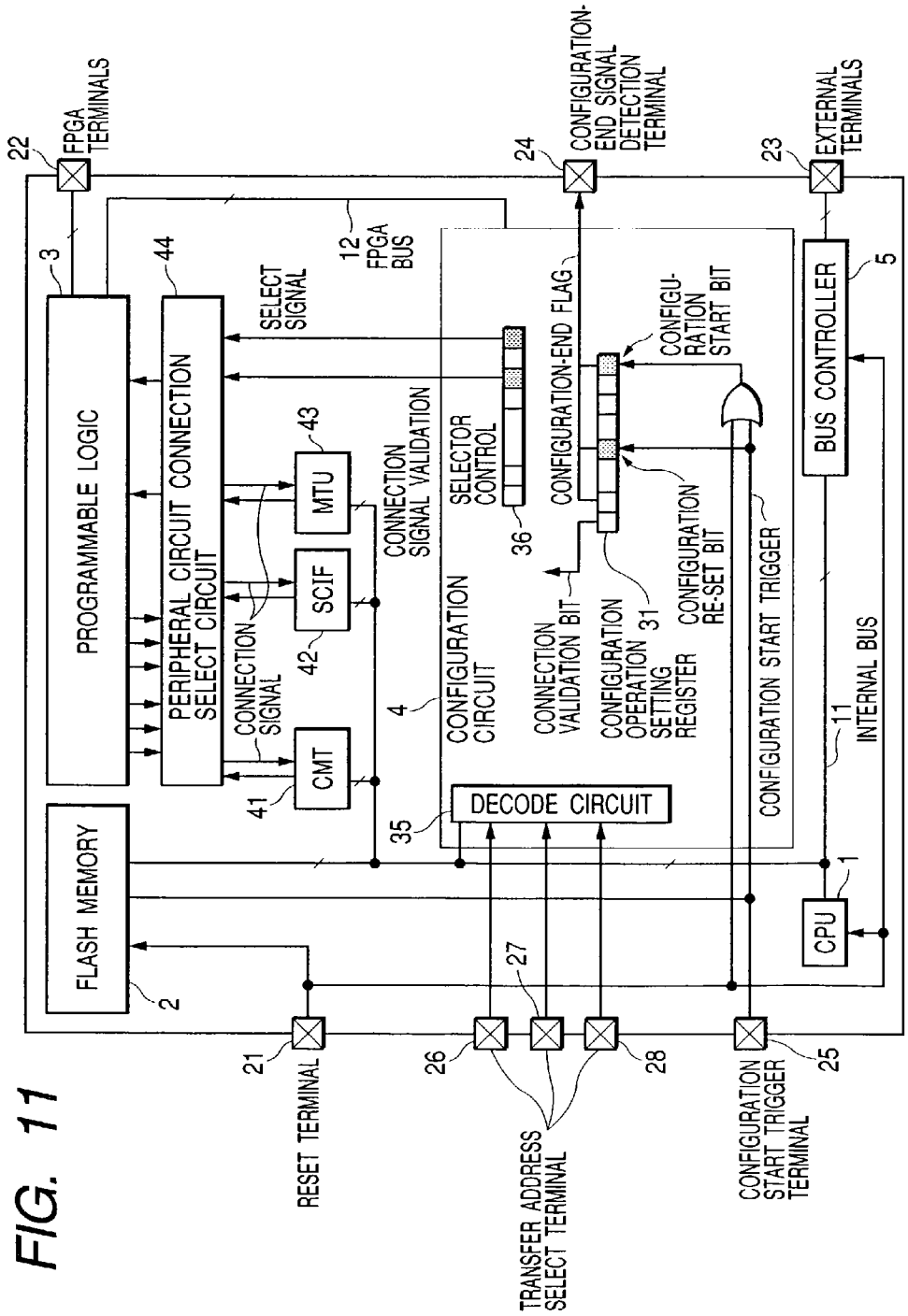
FIG. 11 is a block diagram showing a semiconductor processing device based on a fourth embodiment of this invention.
Figure 12:
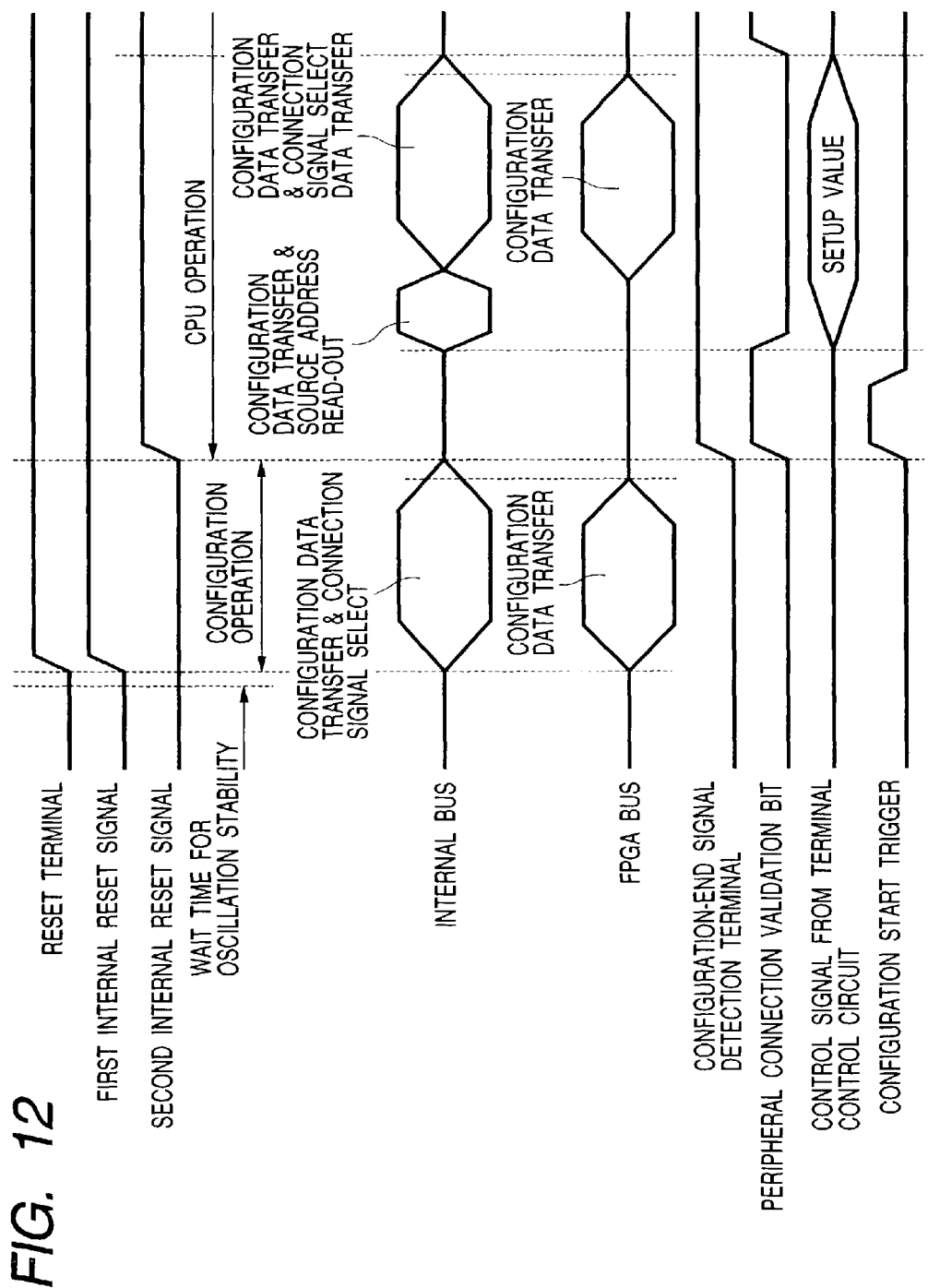
FIG. 12 is a timing chart showing the configuration operation of the semiconductor processing device of the fourth embodiment.

The arrangement and operation of the semiconductor processing device based on the fourth embodiment of this invention will be explained with reference to FIG. 11 and FIG. 12. FIG. 11 shows by block diagram the semiconductor processing device of this embodiment, and FIG. 12 shows by timing chart the configuration operation of the device.

The semiconductor processing device (LSI) of this embodiment includes a CPU 1, a flash memory 2, a programmable logic 3, a configuration circuit 4, a bus controller 5, a CMT 41, an SCIF 42, a MTU 43, and a peripheral circuit connection signal select circuit 44. The LSI differs from the preceding first, second and third embodiments in the inclusion of a circuit which automatically switches the conduction or non-conduction of the signals between the programmable logic 3 and the LSI interior, with some selection signals being multiplexed for selection. The CMT 41, SCIF 42 and MTU 43 which are peripheral circuits can be connected to the internal bus 11 so as to be accessible from the CPU 1.

The CMT 41 is a comparison multi-timer, SCIF 42 is a serial communication interface, and MTU 43 is a multi-function timer pulse unit.

The peripheral circuit connection select circuit 44 includes an FPGA input select circuit, an FPGA output select circuit and a peripheral circuit connection enable/disable control circuit. The FPGA input select circuit has a function of selecting a connection signal from the peripheral circuit to the programmable logic 3 based on the peripheral circuit connection select setting circuit in the configuration circuit 4. The FPGA output select circuit has a function of selecting a connection signal from the programmable logic 3 to the peripheral circuit based on the peripheral circuit connection select setting circuit in the configuration circuit 4. The peripheral circuit connection enable/disable control circuit has function of invalidating the connection signals during the configuration operation so that the peripheral circuit does not malfunction.

The LSI further includes a selector control register 36 in addition to the configuration operation setting register 31 and decode circuit 35.

Based on this arrangement, the configuration circuit 4 implements the configuration operation in a timing relation as shown in FIG. 12.

[1] The configuration operation starts when: (1) The reset terminal 21 has an active input signal; (2) The configuration start trigger terminal 25 has an active input signal; or (3) The configuration start bit of the configuration operation setting register 31 in the configuration circuit 4 is set The configuration re-set bit is set automatically.

[2] During the configuration operation, the peripheral circuit connection select circuit 44 controls so that the connection between the programmable logic 3 and the circuit modules in LSI such as the CMT 41, SCIF 42 and MTU 43 are invalidated. The peripheral circuit connection select circuit 44 negates connection signals.

[3] On completion of configuration operation, the configuration-end flag of the configuration operation setting register 31 in the configuration circuit 4 is set, and at the same time the connection validation bit is also set. The peripheral circuit connection select circuit 44 responds to the setting of the connection validation bit to restore automatically the connection of the circuit modules.

[4] At the configuration re-set operation, the connection validation bit is reset automatically so that the peripheral circuit connection validation bit is retained in the invalid state (deactivated state).

In the foregoing configuration operation of the configuration circuit 4, the following is also possible.

[41] Until the end of program development, it is not yet determined as to which internal I/O of programmable logic 3 and which circuit modules are to be connected.

Assuming that the connection between the internal I/O of programmable logic 3 and the circuit modules in LSI such as the CMT 41, SCIF 42 and MTU 43 is determined fixedly, the restriction of allocation of I/O is imposed on the logic to be built in the programmable logic 3, resulting in a decreased design latitude of the programmable logic 3. Accordingly, providing a function of selecting as to which internal I/O of programmable logic 3 is to be connected to the CMT 41, SCIF 42 and MTU 43 can ease the restriction of allocation of I/O of the programmable logic 3.

[42] The selection by the peripheral circuit connection select circuit 44 can be realized by setting a value in the selector control register 36 in the configuration circuit 4 based on the addition of data in the configuration data so that the data is transferred to the selector control register 36 at the time of configuration operation.

[43] The selector control register 36 may have its value set by the CPU 1 during the ordinary operation.

[44] The connection validation bit may also has its value revised by the CPU 1 during the ordinary operation.

[45] This embodiment may include the functions explained in connection with the first, second and third embodiments.

In consequence, the fourth embodiment attains the effectiveness of: (1) The connection between the programmable logic 3 and the circuit modules such as the CMT 41, SCIF 42 and MTU 43 can be invalidated during the configuration operation and the connection can be restored automatically on completion of configuration; (2) The connection between the programmable logic 3 and the circuit modules is made switchable based on the setting of the selector control register 36, so that the restriction of the assignment of I/O of the programmable logic 3 can be eased.

Embodiment 5

Figure 13:
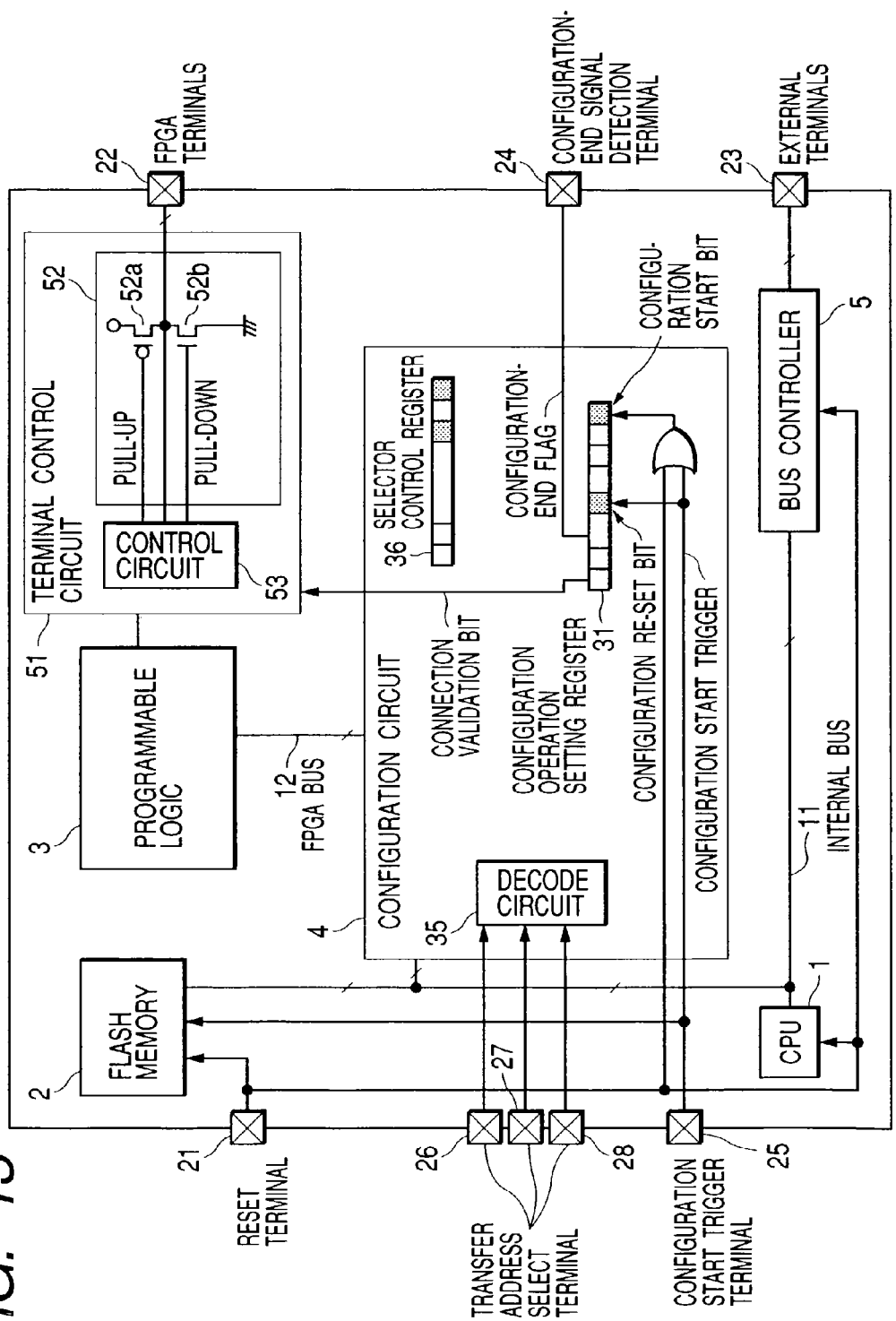
FIG. 13 is a block diagram showing a semiconductor processing device based on a fifth embodiment of this invention.

The arrangement and operation of the semiconductor processing device based on the fifth embodiment of this invention will be explained with reference to the block diagram of FIG. 13.

The semiconductor processing device (LSI) of this embodiment includes a CPU 1, a flash memory 2, a programmable logic 3, a configuration circuit 4, a bus controller 5, and a terminal control circuit 51. The LSI differs from the preceding first through fourth embodiments in the provision of the terminal control circuit 51 which can control the FPGA terminals 22.

Specifically, the terminal control circuit 51 of this LSI includes a pull-up/down circuit 52 and a control circuit 53 associated to the circuit 52. The pull-up/down circuit 52 has a function of controlling the voltage level of the terminals 22 at the configuration operation and a function of pulling the terminals to the high level (MOSFET activated) after power is turned on until the configuration operation ends.

The pull-up/down circuit 52 consists of a pull-up MOSFET 52a and a pull-down MOSFET 52b, with their gates controlled by the control circuit 53, their sources connected to the power voltage and ground voltage, respectively, and their drains connected commonly to the FPGA terminal 22.

Based on this arrangement, the configuration circuit 4 implements the configuration operation in a timing relation as shown in FIG. 12.

[1] The configuration operation starts when: (1) The reset terminal 21 has an active input signal; or (2) The configuration start bit of the configuration operation setting register 31 in the configuration circuit 4 is set (configuration re-set bit is set automatically).

[2] During the configuration operation, the terminal control circuit 51 controls so that the connection between the programmable logic 3 and the FPGA terminals 22 is invalidated.

[3] On completion of configuration operation, the configuration-end flag and connection validation bit in the configuration circuit 4 are set. The terminal control circuit 51 responds to the setting to restore automatically the connection between the programmable logic 3 and the FPGA terminals 22.

[4] At the time of configuration re-set, the connection validation bit is reset automatically to restore the invalidated state (deactivated state) of connection.

In the foregoing configuration operation of the configuration circuit 4, the following is also possible.

[51] In the above [2], since the FPGA terminals 22 are not determined to be input terminals or output terminals or of high-active signals or low-active signals until the configuration ends, the terminal control circuit 51 activates the pull-up MOSFET 52a to pull the FPGA terminals 22 to the high level until the end of configuration, and thereafter deactivates the MOSFETs 52a to validate the connection between the programmable logic 3 and the FPGA terminals 22.

[52] In case the FPGA terminals 22 need to be pulled to the low level, the FPGA terminal control register in the configuration circuit 4 is set so that the pull-down MOSFET 52b is activated instead of the pull-up MOSFET 52a.

[53] Setting of the above item [52] can be either: (1) The control register is set by the CPU 1 during the ordinary operation; or (2) A setup value is added to the configuration data so that it is set to the FPGA terminal control register at the loading of configuration data in the configuration operation.

[54] Although the FPGA terminals 22 cannot be brought to the low level since the turn-on of power, the terminals 22 can have their state fixed when the configuration re-set is intended during the ordinary operation.

[55] This embodiment may include the functions explained in connection with the first through fourth embodiments.

In consequence, the fifth embodiment attains the effectiveness of: (1) The connection between the programmable logic 3 and the external terminals can be invalidated during the configuration operation, and the connection is restored automatically; (2) The pull-up MOSFET 52a is activated so that the FPGA terminals 22 do not affect the LSI adversely during the configuration operation; (3) The FPGA terminals 22 can be fixed to either high level or low level at the time of configuration re-set based on the setting of FPGA terminal control register by which the pull-up MOSFET 52a or pull-down MOSFET 52b is designated.

Figure 14:
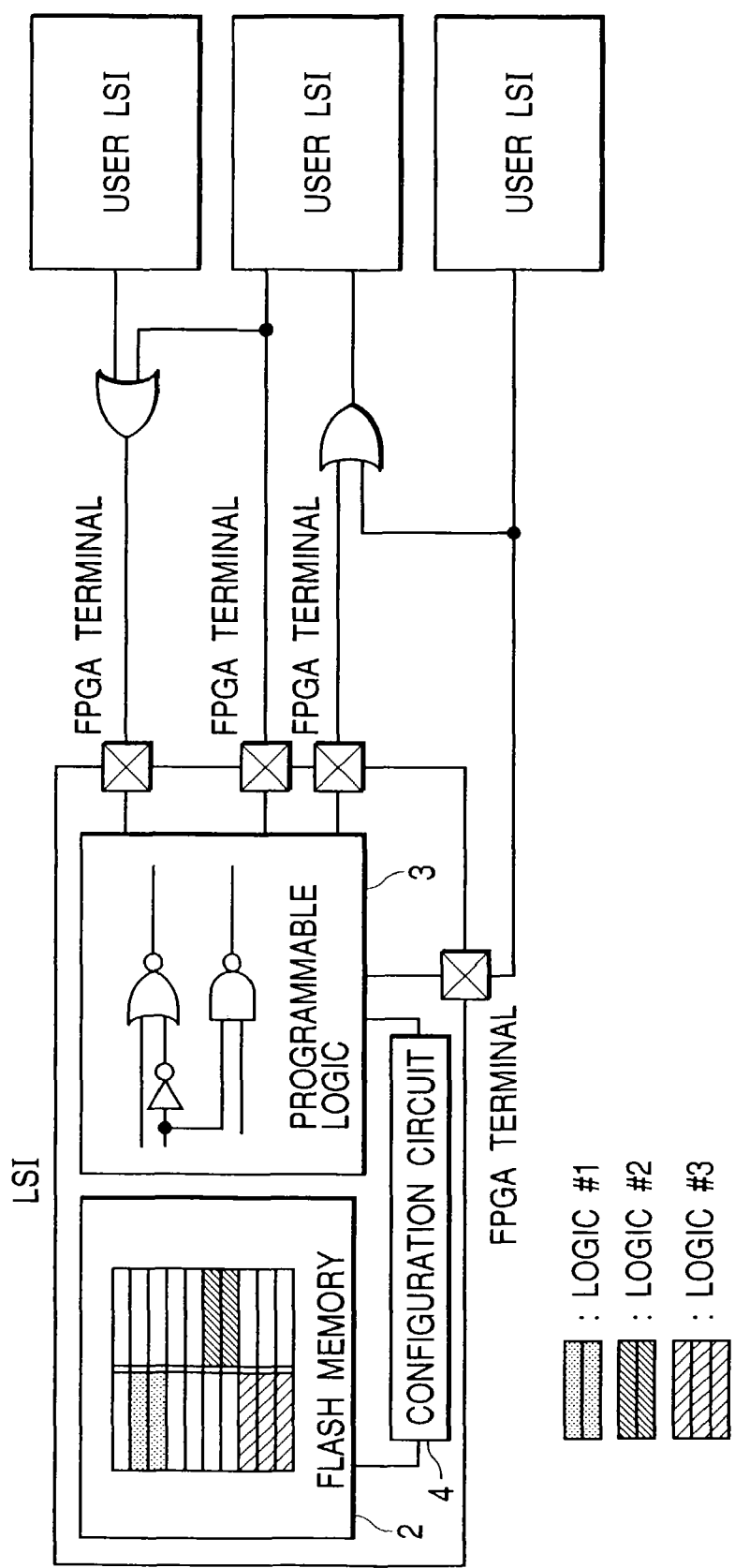
FIG. 14 is an explanatory diagram showing an application system based on the inventive semiconductor processing devices.

FIG. 14 shows an example of application system of the LSIs which have been explained in connection with the first through fifth embodiments. In this example, even in case the total scale of logic #1, logic #2 and logic #3 is larger than or equal to the scale of programmable logic 3, only a logic in need during a period of time is configured dynamically in the programmable logic 3, whereby the use of programmable logic 3 can be minimized and thus a resulting smaller LSI chip can reduce the cost and defect rate of products.

Figure 15:
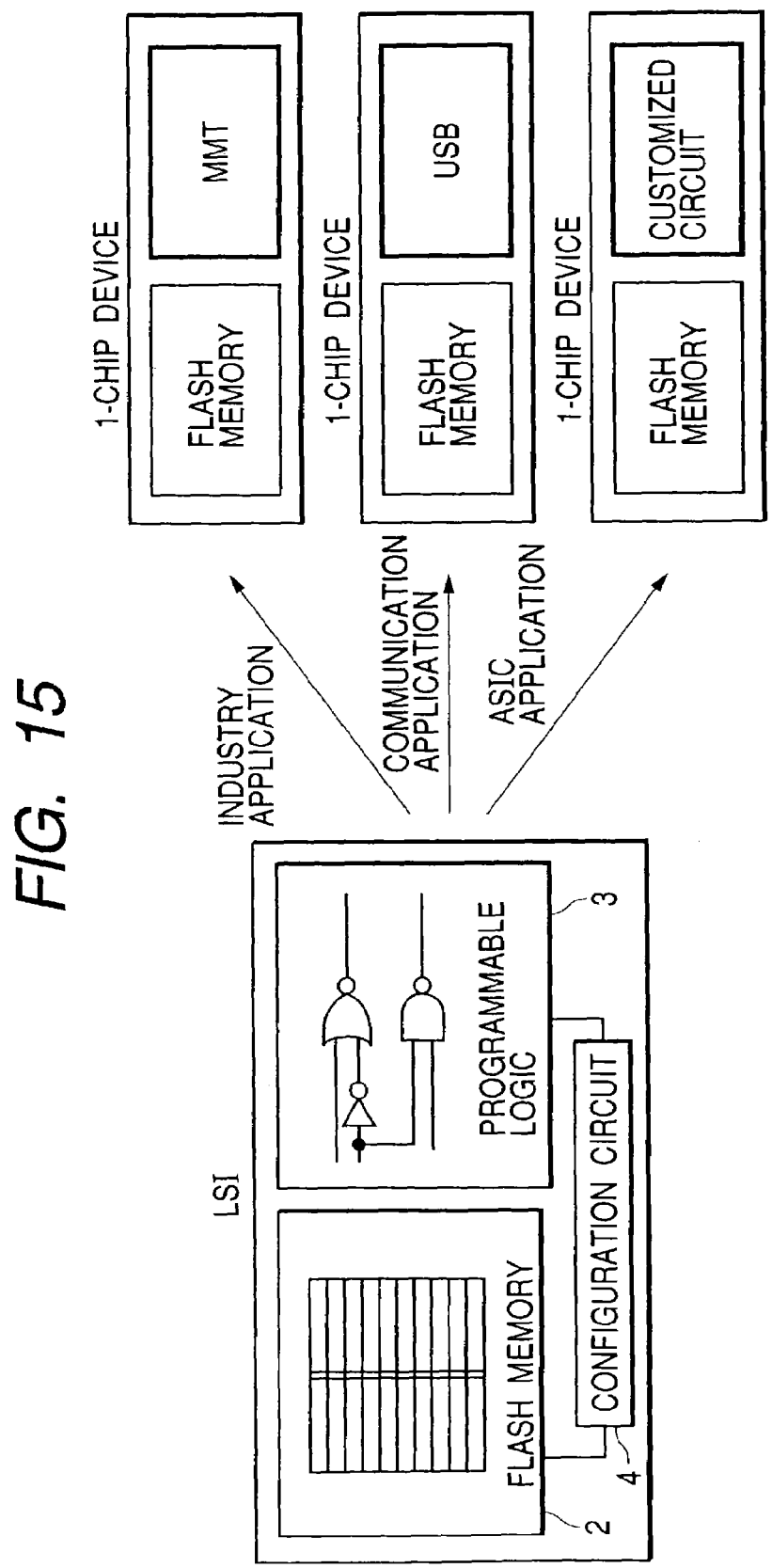
FIG. 15 is an explanatory diagram showing another application system based on the inventive semiconductor processing devices.

FIG. 15 shows another example of application system based on the LSIs. By providing an LSI with a configuration circuit which transfers configuration data which is stored within the chip to the field programmable gate array selectively depending on the requirement, it is generally possible to build a customized logic on one LSI chip intended for industries, communication or ASIC based solely on the software (program)

In the foregoing embodiments, the configuration circuit 4 may function as a bridge circuit for connecting the programmable logic 3 to the internal bus 11 after the transfer of configuration data to the programmable logic 3 is completed.

The FPGA bus 12 can function not only for transfer of configuration data, but for a bus at the time of ordinary operation.

The address bus 15 can be used for addressing of the flash memory 2 in transferring configuration data from an arbitrary memory area.

The address bus 16 can be used for addressing of the programmable logic 3 in loading data other than configuration data to an arbitrary area.

Configuration data can be transferred to the programmable logic 3 also by way of the internal bus 11, besides the exclusive data bus 13.

The connection between the FPGA terminals 22 and an external device can be either the bus connection or the signal line connection. Namely, the connection between the programmable logic 3 and the FPGA terminals 22 is not confined to the bus connection, but can be the connection of control signal lines.

The arrangements shown in the foregoing embodiments can be practiced separately and also in arbitrary combinations.

Although the present invention has been described in connection with the specific embodiments, the invention is not confined to these embodiments, but various alterations are obviously possible without departing from the essence of the invention.

Among the affairs of the present invention disclosed in this specification, the major effectiveness is briefed as follows.

(1) Based on the hardware arrangement of the circuit for implementing the configuration operation which is the requisite of LSI with a built-in SRAM-type field programmable gate array, the LSI can be started in a short time following the event of power-on reset.
(2) A configuration operation program is no more necessary.
(3) Configuration re-set can be facilitated and made flexible.
(4) The end of configuration operation can be informed easily to an external circuit.

What is claimed is:

1. A semiconductor processing device formed on a semiconductor substrate, comprising:
   a central processing unit;
   an SRAM-type field programmable gate array which establishes a logic circuit based on logic building data written thereto;
   a nonvolatile memory which stores the logic building data establishing the logic circuit in the SRAM-type field programmable gate array; and
   a configuration circuit which implements a configuration operation for said SRAM-type field programmable gate array by using the logic building data stored in said nonvolatile memory,
   wherein said configuration circuit has a function of transferring the logic building data in said nonvolatile memory to said SRAM-type field programmable gate array at the event of power-on reset, and
   wherein said configuration circuit includes a function of releasing an internal reset signal on completion of configuration operation.

2. A semiconductor processing device according to claim 1, wherein said nonvolatile memory includes an exclusive bus for transferring the logic building data to said configuration circuit at the time of configuration operation.

3. A semiconductor processing device formed on a semiconductor substrate, comprising:
   a central processing unit;
   an SRAM-type field programmable gate array which establishes a logic circuit based on logic building data written thereto;
   a nonvolatile memory which stores the logic building data establishing the logic circuit in the SRAM-type field programmable gate array;
   a configuration circuit which implements a configuration operation for said SRAM-type field programmable gate array by using the logic building data stored in said nonvolatile memory;
   said configuration circuit having a function of transferring the logic building data in said nonvolatile memory to said SRAM-type field programmable gate array at the event of power-on reset; and
   a terminal which indicates completion of the configuration operation by said configuration circuit,
   the semiconductor processing device further having a function of initiating a peripheral semiconductor device through said terminal.

4. A semiconductor processing device formed on a semiconductor substrate, comprising:
   a central processing unit;
   an SRAM-type field programmable gate array which establishes a logic circuit based on logic building data written thereto;
   a nonvolatile memory which stores the logic building data establishing the logic circuit in the SRAM-type field programmable gate array; and
   a configuration circuit which implements a configuration operation for said SRAM-type field programmable gate array by using the logic building data stored in said nonvolatile memory,
   wherein said configuration circuit has a function of transferring the logic building data in said nonvolatile memory to said SRAM-type field programmable gate array at the event of power-on reset, and
   wherein said nonvolatile memory comprises a flash memory.

5. A semiconductor processing device formed on a semiconductor substrate, comprising:
   a central processing unit;
   an SRAM-type field programmable gate array which establishes a logic circuit based on logic building data written thereto;
   a nonvolatile memory which stores the logic building data establishing the logic circuit in the SRAM-type field programmable gate array; and
   a configuration circuit which implements a configuration operation for said SRAM-type field programmable gate array by using the logic building data stored in said nonvolatile memory,
   wherein said configuration circuit has a function of reconstructing, during the operation of said central processing unit, part of the logic building data in said SRAM-type field programmable gate array which has been transferred from said nonvolatile memory.

6. A semiconductor processing device according to claim 5 wherein said nonvolatile memory comprises a flash memory.

7. A semiconductor processing device formed on a semiconductor substrate, comprising:
- a central processing unit;
- an SRAM-type field programmable gate array which establishes a logic circuit based on logic building data written thereto;
- a nonvolatile memory which stores the logic building data establishing the logic circuit in the SRAM-type field programmable gate array;
- a configuration circuit which implements a configuration operation for said SRAM-type field programmable gate array by using the logic building data stored in said nonvolatile memory; and
- a plurality of terminals in correspondence to the logic building data of said SRAM-type field programmable gate array,
- wherein said configuration circuit has a function of selecting logic building data in said nonvolatile memory in correspondence to said terminals and transferring the selected data to said SRAM-type field programmable gate array.

8. A semiconductor processing device according to claim 7, wherein said nonvolatile memory comprises a flash memory.

9. A semiconductor processing device formed on a semiconductor substrate, comprising:
- a central processing unit;
- an SRAM-type field programmable gate array which establishes a logic circuit based on logic building data written thereto;
- a nonvolatile memory which stores the logic building data establishing the logic circuit in the SRAM-type field programmable gate array; and
- a configuration circuit which implements a configuration operation for said SRAM-type field programmable gate array by using the logic building data stored in said nonvolatile memory,
- wherein said configuration circuit has a register which stores a plurality of data corresponding to the logic building data of said SRAM-type field programmable gate array, and
- wherein said configuration circuit includes a function of selecting logic building data in said nonvolatile memory in correspondence to the data in said register and transferring the selected data to said SRAM-type field programmable gate array.

10. A semiconductor processing device according to claim 9, wherein said nonvolatile memory comprises a flash memory.

* * * * *